United States Patent
de Oliveira et al.

(10) Patent No.: US 8,497,051 B2
(45) Date of Patent: Jul. 30, 2013

(54) METHOD AND COMPOSITION FOR PRODUCING OPTICAL ELEMENTS HAVING A GRADIENT STRUCTURE

(75) Inventors: Peter William de Oliveira, Saarbruecken (DE); Michael Veith, St.-Ingbert (DE); Peter Koenig, Lebach (DE); Jenny Kampka, Merzig (DE); Anette Kraegeloh, Saarbruecken (DE)

(73) Assignee: Leibniz-Institut fuer Neue Materialien Gemeinnuetzige GmbH, Saarbruecken (DE)

(*) Notice: Subject to any disclaimer, the term of this patent is extended or adjusted under 35 U.S.C. 154(b) by 91 days.

(21) Appl. No.: 13/139,524

(22) PCT Filed: Dec. 21, 2009

(86) PCT No.: PCT/EP2009/009177
§ 371 (c)(1),
(2), (4) Date: Jun. 14, 2011

(87) PCT Pub. No.: WO2010/072390
PCT Pub. Date: Jul. 1, 2010

(65) Prior Publication Data
US 2011/0242631 A1 Oct. 6, 2011

(30) Foreign Application Priority Data
Dec. 22, 2008 (DE) .......................... 10 2008 064 168

(51) Int. Cl.
*G03H 1/00* (2006.01)
*G03B 1/04* (2006.01)
*G02B 27/01* (2006.01)
*G11B 13/02* (2006.01)

(52) U.S. Cl.
USPC ................. 430/1; 430/2; 430/321; 359/3

(58) Field of Classification Search
None
See application file for complete search history.

(56) References Cited

U.S. PATENT DOCUMENTS

| 5,593,781 A | 1/1997 | Nass et al. |
|---|---|---|
| 2004/0027625 A1 | 2/2004 | Trentler et al. |
| 2005/0008762 A1 | 1/2005 | Sheu et al. |
| 2008/0081264 A1 | 4/2008 | Mennig et al. |
| 2008/0247009 A1* | 10/2008 | Mennig et al. ............ 359/3 |
| 2011/0236804 A1* | 9/2011 | De Oliveira et al. ........... 430/2 |

FOREIGN PATENT DOCUMENTS

| DE | 19719948 A1 | 11/1998 |
|---|---|---|
| DE | 19746885 A1 | 6/1999 |
| DE | 102004061323 A1 | 6/2006 |
| DE | 102004061324 A1 | 6/2006 |

(Continued)

OTHER PUBLICATIONS

Ogata et al., Novel applications of DNA materials, Proc. SPIE, vol. 7403 pp. 740305-1 to 740305-15 (Aug. 2009).*

(Continued)

*Primary Examiner* — Martin Angebranndt
(74) *Attorney, Agent, or Firm* — Cahn & Samuels, LLP

(57) ABSTRACT

A composition for producing optical elements having a gradient structure, particularly for holographic applications, is formed by a refractive index gradient. The composition is produced from one or more polymerizable and/or polycondensable monomers and at least one biological polymer. A potential difference is generated for the directed diffusion of the monomers by inducing a local polymerization or polycondensation. The result is the formation of a refractive index gradient.

16 Claims, 7 Drawing Sheets

FOREIGN PATENT DOCUMENTS

| | | | |
|---|---|---|---|
| EP | 297051 | * | 12/1988 |
| EP | 302828 | * | 2/1989 |
| EP | 0636111 | A1 | 2/1995 |
| EP | 1860504 | * | 11/2007 |
| WO | WO 03058292 | A1 | 7/2003 |
| WO | 2008004203 | A2 | 1/2008 |
| WO | 2008127401 | A2 | 10/2008 |

OTHER PUBLICATIONS

Miniewicz et al., "Deoxiribonucleic acid based photochromic materials for fast dynamic holography", Appl. Phys. Lett., vol. 91 pp. 041118-1 to 041118-3 (2007).*

Ivanov et al., "Azodye gelatin films for polarization holographic recording", Proc. SPIE vol. 4416 pp. 486-489 (2001).*

Diggs et al. "UV lithographic patterning on spin coated DNA thin films", Proc. SPIE vol. 7040 pp. 70400E-1 to 70400E-5 (2008).*

Sarma et al., "Biopolymers-based gate dielectric for organic field effect transistors", Proc. SPIE vol. 7118 pp. 71180L-1 to 71180L-10 (2008).*

PCT Application No. PCT/EP2009/009177, International Preliminary Report on Patentability and Written Opinion of the International Searching Authority, dated Jun. 29, 2011.

English Abstract of WO 03058292 (A1).

English Abstract of DE 102004061324 (A1).

English Abstract of DE 19746885 (A1).

English Abstract of DE 102004061323 (A1).

English Abstract of WO 2008004203 (A2).

English Abstract of DE 19719948 (A1).

English Abstract of 2008127401 (A2).

* cited by examiner

METHOD AND COMPOSITION FOR PRODUCING OPTICAL ELEMENTS HAVING A GRADIENT STRUCTURE

This patent application is a U.S. national stage application of PCT international application PCT/EP2009/009177 filed on 21 Dec. 2009 and claims priority of German patent document 10 2008 064 168.5 filed on 22 Dec. 2008.

FIELD OF THE INVENTION

The invention relates to a process and to a composition for producing optical elements with gradient structure, especially for holographic applications, wherein the gradient structure is formed by a refractive index gradient, and to an optical element with such a gradient structure.

BACKGROUND OF THE INVENTION

The prior art discloses compositions which describe the introduction of biological polymers, especially of DNA, into an organic matrix. Most of these have the aim of using the sequence information present in the DNA in some way. For example, publication US 2005-0008762 describes the introduction of DNA into a polymer matrix for protection from forgeries. WO 2008-004203 uses the sequence specificity of the DNA for local application of a dye, which then promotes the local formation of optical information, one possible form being that of a hologram.

It is an object of the invention to specify a process and a composition which enable the production of optical elements.

SUMMARY OF INVENTION

The object is achieved by the inventions with the features of the independent claims. Advantageous developments of the inventions are characterized in the dependent claims. The wording of all claims is hereby incorporated by reference into this description. The invention also encompasses all viable combinations of independent and/or dependent claims, and more particularly all of those mentioned.

The object is especially achieved by a process. Individual process steps are described in detail hereinafter. The steps need not necessarily be performed in the sequence mentioned, and the process to be outlined may also have further unspecified steps.

In a first step, a composition is prepared from one or more polymerizable or polycondensable monomers and at least one biological polymer.

A biological polymer in the context of the invention is understood to mean naturally occurring polymers, for example (deoxy)ribonucleic acids (DNA or RNA), polypeptides or proteins. However, these polymers need in no way originate from natural organisms or a sequence known from nature. A biological polymer in the context of the invention additionally also encompasses polymers derived from the aforementioned polymers. This may involve slight modifications, such as alkylations or substitutions, but also derived systems therefrom such as peptide nucleic acids (PNA) or peptides formed from β-amino acids. The biological polymer may be present in any desired conformations and/or structures.

In a further step, a potential difference for directed diffusion of the monomers to form a refractive index gradient is generated by inducing local polymerization or polycondensation.

The potential difference preferably generates a chemical potential difference, for example analogously to the Colburn-Haines effect described below, which is based on the following mechanism: in the case of a local induced polymerization or polycondensation of species with polymerizable or polycondensable groups, for example carbon-carbon multiple bonds or epoxide rings, the polymerization or polycondensation leads to a depletion of polymerizable or polycondensable groups in the regions in which the polymerization or polycondensation takes place. This leads to directed diffusion of monomers with as yet unreacted polymerizable or polycondensable groups into the regions in which polymerization or polycondensation takes place, or has taken place, in order to balance out the chemical potential difference. These monomers are available for polymerization in these regions. This leads to a change in the optical density in these regions and hence to a local increase or decrease in the refractive index.

The expressions "polymerization" and "polymerizable" used above also include polyaddition and groups capable of polyaddition.

It has been found that, surprisingly, a composition composed of one or more polymerizable and/or polycondensable monomers and at least one biological polymer can be used to produce stable and high-quality optical elements in a simple manner, by generating a potential difference in this composition.

The potential difference is preferably a chemical potential difference. This chemical potential difference is preferably generated by exposure or electron irradiation, especially by holographic or lithographic techniques or by means of the mask aligner technique. By selective irradiation or exposure of the composition, it is possible, for example at local sites, to trigger controlled polymerization and/or polycondensation, which leads to a chemical potential difference, which in turn leads to the direct diffusion of the monomers and formation of a refractive index gradient.

Without being bound to a particular system, one possible explanation for this reaction would be that the local polymerization and/or polycondensation forms a component with a particular refractive index, or the concentration thereof is increased there, which is balanced by the fact that the refractive index of the other regions is likewise altered by the diffusion of the monomers.

In a major simplification, the system before the application of the potential difference can also be viewed as a homogeneous mixture of two components with different refractive indices, which also includes precursor compounds for one component. The directed diffusion results in local alterations in the proportions of the two components. This causes the refractive index gradient observed.

It follows from this that, as mentioned above, the change in the refractive index should always be considered in relation to the regions without polymerization or polycondensation. What is crucial is the resulting difference in the refractive index. Which region has a higher or lower refractive index can be determined, for example, by the selection of the monomers and of the biological polymer, or of other components.

Without being bound to a particular theory, it may be suspected that the irradiation in the biological material forms a particularly high number of reactive species, for example free radicals, cations or anions, which locally induce polymerization in these regions.

For the exposure process, preference is given to using UV light or laser light. In the case of use of a laser as the light source, it is possible by means of holographic techniques to produce either periodic grid structures or Fresnel structures. The intensity profiles which occur as a result of interference act as polymerization sinks. For the particularly preferred holographic exposure, it is possible to produce, for example by means of two-wave mixing, phase-modulated volume holograms as transmission or reflection holograms.

The coherent light source used may, for example, be an argon ion laser.

After the production of the gradient structure, the unpolymerized or unpolycondensed monomers can be depleted homogeneously by a non-local induction of a polymerization or polycondensation, for example a non-intensity-modulated exposure. Since no further directed diffusion at all occurs in this case, there is no more than slight attenuation of the diffractive index gradient already generated. However, this can distinctly improve the life time of the gradient structures produced.

In an advantageous development of the invention, the at least one biological polymer absorbs the wavelengths used to write the hologram. Advantageously, more than 50% of the monomers of this biological polymer or of the biological polymers have aromatic or heteroaromatic groups. These may, for example, be nucleobases, such as adenine, guanine, cytosine or thymine, but also aromatic amino acids, such as phenylalanine or tryptophan. In the case of nucleobases, the biological polymer may be DNA, RNA or a derivative thereof. Derivatives may involve modifications to the nucleobases, for example alkylations, such as 5-methylcytosine, 4-O-methylthymine, 7-alkyl-7-deazaguanine or 7-alkyl-7-deazaadenine, but also modification to the backbone of the polymer, such as methylation of the phosphate groups, use of other sugar units or exchange of the sugar backbone for peptides, for example peptide nucleic acids (PNA). The biological polymer may also consist of natural and unnatural units.

The size of the biological polymer may depend on the biological polymer used. In the case of DNA and/or derivatives thereof, a size of more than 50 bases of a single strand up to genomic DNA is possible; preference is given to a size of more than 200 bases, for example of 200 to 10 000 bases or 200 to 1000 bases. The DNA and/or derivatives thereof may be present as a single strand or as a double strand. Preference is given to double-strand DNA. It is suspected that specifically double-strand DNA is particularly advantageous for the generation of the polymerization-initiating species. Given the size of the DNA, it can be assumed that the DNA virtually does not diffuse into the composition.

The biological polymer can be obtained by all techniques known to those skilled in the art. These include both extraction and synthesis. The biological polymers may be commercially available.

In an advantageous development of the invention, the composition comprises the following components:
 (a) 2 to 98% by weight of one or more polymerizable or polycondensable monomers;
 (b) 0.001% by weight to 1% by weight of one or more biological polymers.

In addition, the composition may also comprise 0 to 5% by weight of one or more additive(s) selected from sensitizers, wetting aids, adhesion promoters, leveling agents, antioxidants, stabilizers, dyes, photochromic of thermochromic compounds.

Advantageously, all components of the composition are miscible with one another. Preferably, at least all components are present in a common phase.

In a preferred development, the biological polymer is present in a form soluble in the composition. Biological polymers are often so hydrophilic that they barely dissolve, if at all, in the composition which is usually relatively hydrophobic due to the high organic content. For such cases, the person skilled in the art is aware of ways of increasing the hydrophobicity of the biological polymer, specifically of DNA and derivatives thereof. These include, in addition to the preparation of derivatives, such as the modification of the biological polymer with long alkyl chains, the reversible addition of interface-active substances, preferably surfactants. In the case of strongly negatively charged biological polymers, such as DNA and/or derivatives thereof, cationic surfactants are preferred. Examples thereof are quaternary ammonium ions of the formula $NR_4^+$ where R may be the same or different and is selected from alkyl radicals between one and 30 carbon atoms, which may also be substituted. This also includes isomers. The carbon chains may also be interrupted by heteroatoms or else contain aromatic radicals, such as phenyl or benzyl. An advantageous compound is one of the formula $NR'R_3^+$ where R is a $C_{1-4}$ alkyl radical, preferably methyl or ethyl, and R' is a radical between 4 and 30 carbon atoms. Preference is given to lauryl, myristyl, cetyl, heptadecyl, behenyl or stearyl, where the alkyl radicals may also be unsaturated. Examples are cetyltrimethylammonium, stearyltrimethylammonium and cetyltrimethylammonium. The substances are preferably used in the form of salts, preferably chlorides and bromides. Further cationic surfactants are alkylated heteroaromatics such as pyridinium ions. Examples thereof are laurylpyridinium or cetylpyridinium. These compounds too are preferably used as halides, for example chlorides or bromides. It is also possible to use cationic dendrimers or polymers which are used, for example, for transfection of cells with DNA, for example DEAE dextran or cationic lipids (e.g. Lipofectin™).

The substances may also be coupled to the biological polymer via a covalent bond, for example by reaction with hydroxyl, amino, carboxylic acid or carboxyl groups or other reactive groups. This may also include cycloadditions or addition reactions with double bonds present in the biopolymer.

In the case of DNA and/or derivatives thereof, it is also possible to use intercalators. These are molecules which are intercalated between the bases of the DNA. If these intercalators are provided with long alkyl groups, they can also contribute to increased hydrophobicity. Examples thereof are alkylated polycyclic aromatics, for example pyrene or naphthalene, which may also contain heteroatoms. Known intercalators are also DNA dyes known to those skilled in the art, such as ethidium bromide, SYBR Green, porphyrins, TOTO or YOYO-1.

It may also have other molecules which bind to the nucleic acids and bind in the major or minor groove, for example oligomers of pyrroles and/or imidazoles.

It is also possible to use mixtures of different interface-active substances.

The substances can be added directly to the composition. It is preferred that the biological polymer, in a separate process step, is converted to the a form which dissolves in the composition. Advantageously, for this purpose, the biological polymer is precipitated, for example from water, by the addition of the interface-active substance. The proportion by weight of the one or more biological polymer(s) is then determined on the weight of the precipitated polymer, i.e. in combination with the interface-active substance.

The ratio of the interface-active distance to the biological polymer depends on the biological polymer. Preference is given to a ratio of about 1:1 by weight.

The polymerizable or polycondensable organic monomer or the polymerizable or polycondensable organic monomers may in principle comprise any species which is known to those skilled in the art and which is suitable for polymerization or polycondensation. For example, it is possible to use polymerizable or polycondensable monomers, oligomers or prepolymers. The monomers may also contain more than one polymerizable or polycondensable group. Preference is given to monomers which give rise to transparent polymers.

Specific examples for polymerization or polycondensable organic monomers are (meth)acrylic acid, (meth)acrylic esters, (meth)acrylonitrile, styrene and styrene derivatives, alkenes (e.g. ethylene, propylene, butene, isobutene), halogenated alkenes (e.g. tetrafluoroethylene, chlorotrifluoroethylene, vinyl chloride, vinyl fluoride, vinylidene fluoride, vinylidene chloride), vinyl acetate, vinylpyrrolidone, vinylcarbazole and mixtures thereof. It is also possible for polyunsaturated monomers to be present, for example butadiene and (meth)acrylic esters or polyols (e.g. diols).

Preference is given to acrylates or methacrylates, especially methyl methacrylate, a diol(meth)acrylate or a diol di(meth)acrylate, for example hexanediol dimethacrylate (HDMA), hexanediol diacrylate, dodecanediol dimethacrylate and dodecanediol diacrylate. It is also possible to use silicone acrylates or similar compounds as monomers. It is also possible to use mixtures of monomers.

Particular preference is also given to acrylates or methacrylates with one or more polymerizable groups, called crosslinkers, which have been modified with oligomers and/or polymers. Very particular preference is given to monomers with a molar mass of up to 5000 g/mol, preferably up to 1500 g/mol, more preferably between 27 g/mol and 600 g/mol. Examples of such monomers are polyethylene glycol di(meth)acrylates (PEGDMA), polyethylene glycol(meth)acrylates (PEGMA), tetramethylene glycol di(meth)acrylates (TMGDMA), bisphenol A di(meth)acrylates, (BPADMA) or tetra-ethylene glycol di(meth)acrylates (TEGDMA).

According to the invention, (meth)acrylates are understood to mean both the particular acrylate and the particular methyl acrylate; this applies analogously to (meth)acrylic acid or (meth)acrylic ester.

The composition may additionally comprise additives customary for optical systems. Examples are plasticizers, sensitizers, wetting aids, adhesion promoters, leveling agents, antioxidants, stabilizers, dyes and photochromic or thermochromic compounds.

As already stated, the biological polymer itself appears to generate the species needed for local polymerization. One advantage of the inventive system is therefore also that it is not reliant on the addition of thermal or photochemical crosslinking initiators. Nevertheless, it could be advantageous, for example crosslinking initiators which accelerate the curing of the composition after establishment of the refractive index gradient. Useful catalysts/initiators or crosslinking initiators for this purpose include all familiar initiator/initiator systems known to those skilled in the art, including free-radical photoinitiators, free-radial thermoinitiators, cationic photoinitiators, cationic thermoinitiators and any desired combinations thereof.

Specific examples of usable free-radical photoinitiators are Irgacure® 184 (1-hydroxycyclohexyl phenyl ketone), Irgacure® 500 (1-hydroxycyclohexyl phenyl ketone, benzophenone) and other photoinitiators of the Irgacure® type available from Ciba-Geigy, Darocure 1173, 1116, 1398, 1174 and 1020 (from Merck), benzophenone, 2-chlorothioxanthone, 2-methylthioxanthone, 2-isopropylthioxanthone, benzoin, 4,4'-dimethoxybenzoin, benzoin ethyl ether, benzoin isopropyl ether, benzil dimethyl ketal, 1,1,1-trichloroacetophenone, diethoxyacetophenone and dibenzosuberone.

Examples of free-radical thermoinitiators are preferably organic peroxides in the form of diacyl peroxides, peroxydicarbonates, alkyl peresters, alkyl peroxides, dialkyl peroxides, perketals, ketone peroxides and alkyl hydroperoxides, and also azo compounds. Specific examples which should be mentioned here are especially dibenzoyl peroxide, tert-butyl perbenzoate and azobisisobutyronitrile. One example of a cationic photoinitiator is Cyracure® UVI-6974, while a preferred cationic thermoinitiator is 1-methylimidazol.

Polycondensation-inducing catalysts are, for example, Brønsted acids and bases, such as mineral acids or tertiary amines, for the anionic polycondensation, and Lewis acids, such as metal alkoxides (e.g. aluminum alkoxides in the case of epoxy silanes), for the cationic polycondensation. In the case of involvement of epoxy groups, the addition of ring-opening catalysts, for example N-alkylimidazoles, is particularly advantageous.

As already stated, the use of such catalysts or sensitizers is not obligatory and not preferred.

Optionally, the composition may also comprise one or more solvents, preferably organic solvents, for example alcohols such as ethanol, isopropanol or butanol, ketones such as acetone, esters such as ethyl acetate, ethers such as tetrahydrofuran, and aliphatic, aromatic and halogenated hydrocarbons such as hexane, benzene, toluene and chloroform.

The solvent content of the composition can be varied before or after the establishment of the refractive index gradient, for example by heating. Preference is given to a solvent content of 0 to 70% by weight. If the proportions of the other constituents, for example of the one or more polymerizable and/or polycondensable monomer(s) and of the one or more biological polymer(s), do not add up to 100%, preference is given to making up the missing proportion with at least one solvent.

In an advantageous development, the composition may also comprise a matrix material. This is especially advantageous when monomers which have not been modified with an oligomer or polymer are used. The matrix added can both influence the formation of the refractive index gradient, for example by influencing the diffusion of the monomers, and, as already stated, influence the refractive index gradient which forms. In addition, the matrix can contribute to stabilization of the refractive index gradient. Preference is given to matrix materials which are soluble in the composition.

The amount of matrix material is uncritical and may be between 0.1 and 98% by weight.

The matrix material may comprise a polymerizable or polycondensable organic monomer, oligomer and/or prepolymer, an organic polymer and/or a condensate formed from one or more hydrolyzable, optionally organically modified inorganic compounds. The matrix material preferably comprises at least one organic polymer.

The organic polymers which may be present in the matrix material may be any desired known polymers. Preference is given to polymers which dissolve in the abovementioned solvents or mixtures thereof, for example polyacrylic acid, polymethacrylic acid, polyacrylates, polymethacrylates, polyethylene glycols, polyolefins, polystyrene, polyamides, polyimides, polyvinyl compounds such as polyvinyl chloride, polyvinyl alcohol, polyvinyl butyral, polyvinyl acetate, polyvinylpyrrolidone, paravinylguaiacol and corresponding copolymers, for example poly(ethylene-vinyl acetate), polyesters, e.g. polyethylene terephthalate or polydiallyl phthalate, polyarylates, polycarbonates, polyethers, e.g. polyoxymethylene, polyethylene oxide and polyphenylene oxide, polyether ketones, polysulfones, polyepoxides, fluoropolymers, e.g. polytetrafluoroethylene, and organopolysiloxanes.

It is also possible to use silicones or similar polymers. Copolymers formed from different monomers are also suitable. They are preferably transparent polymers. Preference is given to polymers having a mean molecular weight of 8000 to 43 000 g/mol.

In an advantageous development, the composition may also comprise a preferably transparent, curable matrix.

Curing is understood in this case to mean polymerizations, polycondensations and/or polyadditions which lead to solidification of the matrix.

The amount of curable matrix is uncritical and may be between 0.1 and 98% by weight. This relates especially advantageously to the aspect when the stabilization of the refractive index gradient is required. The curable matrix influences the formation of the refractive index gradient by, for example, altering the diffusion of the monomers. In addition, it is also possible, as already stated, to use the refractive index difference between matrix and the polymerized or polycondensed monomers to form the refractive index gradient. The curing of the matrix can be performed before, during and after the generation of the potential difference, preferably before the generation of the potential difference.

Preference is given to using matrix materials, or precursors of the curable matrix, which are soluble in the composition.

The curable matrix may comprise, for example, the customary organic binder systems for coating materials and resins. The matrix can be cured physically or preferably chemically. The resins may be oxidatively curing, cold-curing or thermally or radiatively curing resins. The coating materials may be one- or two-component coating materials. Preference is given to chemically curing or crosslinkable binder systems. Such curable binder systems are familiar to those skilled in the art.

The usable binder systems or coating materials, or the polymers or oligomers or precursors thereof used therefor, are, for example, the customary binder systems known from the prior art. More particularly, they are organic polymers, oligomers or precursors thereof. The precursors of the polymers or oligomers are understood to mean the monomers or low molecular weight polymerization, condensation or addition products formed therefrom, from which the polymers or oligomers are derived.

Examples of binder systems or coating materials or the organic polymers or oligomers used therefor are epoxy resin coating materials, such as bisphenol A resins, bisphenol F resins, aliphatic and heterocyclic epoxy resins or thermoplastic epoxy coating resins; oil-based coating materials which comprise oils, for example linseed oil, wood oil or soya bean oil, which have optionally been modified with polybutadiene oils; nitrocellulose coating materials which comprise nitrocelluloses; coating materials composed of cellulose esters or organic acids, such as esters of cellulose with acetic acid or butteric acid or the anhydrides thereof, cellulose acetobutyrates, for example, also finding use in polyurethane coating materials; chlororubber coating materials which comprise, for example, chlorinated polyisoprene, polypropylene or polyethylene; coating materials composed of polyvinyl compounds or polyvinyl resins, such as polyolefins, e.g. polyethylene, ethylene-vinyl acetate copolymers and ethylene-maleic acid/anhydride copolymers, PVC, polyvinylidene chloride, polyvinyl alcohol, polyvinyl acetals, e.g. polyvinyl butyral, polyvinyl ethers, e.g. methane or ethyl ethers, polyvinyl esters, e.g. polyvinyl acetate (PVA) and polyethylene terephthalate, polyvinylpyrrolidone, polystyrene, styrene-acrylonitrile copolymers (SAN), acrylonitrile-butadiene-styrene copolymers (ABS), styrene-maleic ester copolymers, styrene-butadiene copolymers and styrene-maleic anhydride copolymers; coating materials based on acrylic resins, such as polyacrylic acid, polymethacrylic acid, polyacrylamide, acrylic esters or methacrylic esters, e.g. polymethyl(meth) acrylate; alkyd resins which contain dibasic acids or anhydrides, such as phthalic acid and phthalic anhydride, and polyols or condensation products thereof which have been oil- or fatty acid-modified; saturated polyester coating resins which contain saturated polyesters formed from saturated monomers having two or more functional groups (OH and/or COOH groups); polyurethane coating materials, which are frequently used in the form of two-component systems which comprise blocked or unblocked polyisocyanates and polyhydroxyl compounds; silicone resin coatings; urea coating materials, melamine coating materials and phenol resin coating materials; and polyarylates, polyamides, polyethers, polyimides and polycarbonates. It is also possible to use combinations of these coating materials or of these polymers. It is always also possible to use the precursors, for example the monomers of the polymers or oligomers mentioned.

Preferred binder systems are polyurethane resin coating materials and polyepoxy resin coating materials. The binder system also comprises any hardeners or crosslinkers used.

The binder system is preferably one which does not react with the monomers used and hence reacts independently of the polymerization of the photopolymer.

Organic polymers used with preference, or oligomers or precursors thereof, such as monomers, are polyepoxides, polyols, unblocked or especially blocked polyisocyanates, polyesters, polyamines, polycarboxylic acids or polycarboxylic anhydrides, each of which contain two or more functional groups. The expression "poly" relates here to the functional group and not to the degree of polymerization. Accordingly, the polyols have two or more hydroxyl groups, and the molecule may be a monomer, oligomer or polymer (e.g. a polyurethane). Specific components are illustrated by way of example hereinafter by preferred binder systems.

It is possible to use epoxy-based binder systems known to those skilled in the art. Examples of polyepoxides are bisphenol A resins (e.g. condensation products of bisphenol A and epichlorohydrin), bisphenol F resins (e.g. condensation products of bisphenol F and epichlorohydrin), aliphatic epoxy resins (e.g. low-viscosity glycidyl ethers), cycloaliphatic epoxy resins and heterocyclic epoxy resins (e.g. triglycidyl isocyanurate) or thermoplastic epoxy resin coating materials. Such systems also include the use of "expanding monomers" (e.g. spiroorthocarbonates or spiroorthoesters), which can also be formed only once in situ. Frequently, polyepoxy resins for film formation are admixed with hardeners in order to achieve crosslinking. Useful hardeners include organic or inorganic compounds with reactive hydrogen, which can react with epoxy or hydroxyl groups. Examples of hardeners used are polyamines (e.g. diamines such as ethylenediamine, cyclohexamine derivatives), polyaminoamide resins, polyisocyanates, hydroxyl-containing synthetic resins, such as urea resins, melamine resins and phenol resins, fatty acids and organic acids with reactive double bonds, such as acrylic acid or methacrylic acid. In the case of use of the latter hardeners, the crosslinking can also be effected by electron beams.

Polyisocyanates are used, for example, for polyurethane resins. The polyisocyanate may have two or more isocyanate groups. It may, for example, be aliphatic, alicyclic, aromatic or heterocyclic, monocyclic or polycyclic.

It is possible to use customary polyisocyanates, for example monomeric polyisocyanates, polyisocyanate adducts, what are called modified polyisocyanates, or mixtures thereof. These are known to those skilled in the art and are commercially available.

The polyisocyanate adducts are, for example, those which typically find use as hardeners for two-component urethane coating materials.

Examples of suitable polyisocyanates are the diisocyanates known from polyurethane chemistry, for example 1,3-diisocyanatobenzene, toluylene 2,4- and 2,6-diisocyanate (TDI), hexamethylene 1,6-diisocyanate (HMDI), diphenylmethane 4,4-' and 2,4-diisocyanate (MDI), naphthylene diisocyanate, xylylene diisocyanate, isophorone diisocyanate, paraphenyl diisocyanate, dicyclohexylmethane diisocyanate, cyclohexyl diisocyanate, polymethylpolyphenyl isocyanate, 1,6-dodecamethylene diisocyanate, 1,4-bis(isocyanatocyclohexyl)methane, pentamethylene diisocyanate, trimethylene diisocyanate, triphenylmethane diisocyanate, and the higher molecular weight polyisocyanates derived from these diisocyanates, for example based on isocyanurate, uretdione, allophanate and biuret.

The isocyanates are available, for example, under the Desmodur and Baymidur trade names (from Bayer), CARADATE (from Shell), TEDIMONX (from Enichem) and LUPRANAT (from BASF). Examples of monomeric polyisocyanates having more than two isocyanate groups are, for example, 4-isocyanatomethyl-1,8-octane diisocyanate and aromatic polyisocyanates such as 4,4',4''-triphenylmethane triisocyanate or polyphenyl-polymethylene polyisocyanates.

The polyisocyanate can be used in blocked form in order to prevent a reaction of uncontrolled rapidity from setting in, and can become reactive only after deblocking, for example by heating. The blocking of isocyanates is a process known to those skilled in the art for reversibly lowering the reactivity of isocyanates. All common blocking agents are useful for blocking of the isocyanates, for example acetone oxime, cyclohexanone oxime, methyl ethyl ketoxime, acetophenone oxime, benzophenone oxime, 3,5-dimethylpyrazole, 1,2,4-triazole, ethyl malonate, ethyl acetate, β-caprolactam, phenol or ethanol.

The polyol components used may be pure di-, tri- or polyalcohols, for example ethylene glycol, trimethylolpropane, or partially hydrolyzed fatty acid glycerides. However, these are usually used only as a starting basis for higher molecular weight polyhydroxyl compounds. These may, for example, be more or less branched polyesterpolyols formed with dicarboxylic acids (Desmophen® products) or polyetherpolyols formed by addition of epoxides (Desmophen® U products). Other examples are hydroxy-functional acrylic resins (Desmophen A products).

The polyisocyanates and the polyols can form polyurethane resin coating materials. Of course, in the case of unblocked polyisocyanates in particular, it may be necessary to mix the components with one another only shortly before use. Polyisocyanates can also be reacted with compounds having other functional groups which contain active hydrogen. Examples of these groups are thiol groups (—SH), primary or secondary amino groups (—NHR' in which R' is, for example, H, alkyl, cycloalkyl, aryl and corresponding aralkyl and alkaryl groups) or carboxyl groups (—COOH). The reaction products formed in the reaction with isocyanates are urethanes (in the case of hydroxyl and carboxyl), thiourethanes (in the case of thiol) or ureas (in the case of amine).

Polyamides are condensation products of diamines and dicarboxylic acids or derivates thereof, and aliphatic and/or aromatic compounds can be used. Polyamides with aromatic units are of particular interest with regard to thermal stability. Also notable for high thermal stability are polyimides, for example polycondensates of aromatic diamines, such as benzidine, 4,4-diaminodiphenyl ether or 4,4'-bis(3-aminophenoxy)diphenyl sulfone, and aromatic tetracarboxylic acids or derivatives thereof, such as 4,4'-benzophenonetetracarboxylic dianhydride or pyromellitic dianhydride, and polybenzimidazoles which are condensation products of aromatic tetramines and dicarboxylic acids or derivatives thereof. In the inventive composition, it is possible to use, for the polymers mentioned, the corresponding monomers or low molecular weight condensation products.

The aforementioned binder systems are especially suitable for coating compositions. However, they are also suitable as binder systems for molding materials for production of moldings, moldings also including films. Epoxy resins or polyurethane resins are, for example, also very suitable for production of moldings.

Specifically in the case of use of epoxy resins, virtually no shrinkage is observed any longer as a result of the polymerization of the monomer. In the case of use of self-curing resins, there is also no need for exposure to cure the matrix.

However, the curing can also be combined with the depletion of monomers unconverted in the formation of the gradient structure.

In an advantageous development, the curable matrix material used may also be an organically modified inorganic condensate formed from polymerizable or polycondensable monomers and/or hydrolyzable silanes which may also have polymerizable and/or polycondensable groups. Such compositions are known, for example, from WO 03/058292, which is hereby explicitly incorporated by reference.

These may, for example, be hydrolyzable and condensable compounds of Si, Al, B, Pb, Sn, Ti, Zr, V and Zn, especially those of Si, Al, Ti and Zr or mixtures thereof.

Particularly preferred matrix materials are polycondensates formed from one or more hydrolyzable and condensable silanes, at least one silane optionally having a nonhydrolyzable radical which is polymerizable or polycondensable. Particular preference is given to using one or more silanes with the following general formulae (I) and/or (II):

$$SiX_4 \qquad (I)$$

in which the X radicals are the same or different and are each hydrolyzable groups or hydroxyl groups,

$$R_aSiX_{(4-a)} \qquad (II)$$

in which R is the same or different and is a nonhydrolyzable radical which optionally has a polymerizable or polycondensable group, X is as defined above and a is 1, 2 or 3, preferably 1 or 2.

In the above formulae, the hydrolyzable X groups are, for example, hydrogen or halogen (F, Cl, Br or I), alkoxy (preferably $C_{1-6}$-alkoxy, for example methoxy, ethoxy, n-propoxy, i-propoxy and butoxy), aryloxy (preferably $C_{6-10}$-aryloxy, for example phenoxy), acyloxy (preferably $C_{1-6}$-acyloxy, for example acetoxy or propionyloxy), alkylcarbonyl (preferably $C_{2-7}$-alkylcarbonyl, for example acetyl), amino, monoalkylamino or dialkylamino having preferably 1 to 12 and especially 1 to 6 carbon atoms in the alkyl group(s).

The nonhydrolyzable R radical is, for example, alkyl (preferably $C_{1-6}$-alkyl, for example methyl, ethyl, n-propyl, isopropyl, n-butyl, s-butyl and t-butyl, pentyl, hexyl or cyclohexyl), alkenyl (preferably $C_{2-6}$-alkenyl, for example vinyl, 1-propenyl, 2-propenyl and butenyl), alkynyl (preferably $C_{2-6}$-alkynyl, for example acetylenyl and propargyl) and aryl (preferably $C_{6-10}$-aryl, for example phenyl and naphthyl). The R and X radicals mentioned may optionally have one or more customary substituents, for example halogen, ether, phospho, sulfo, cyano, amido, mercapto, thioether or alkoxy groups, as functional groups.

The R radical may contain a polymerizable or polycondensable group. These also include the above alkenyl and alkynyl groups. Specific examples of the polymerizable or polycondensable groups of the R radical are epoxy, hydroxyl, amino, monoalkylamino, dialkylamino, carboxyl, allyl, vinyl, acryloyl, acryloyloxy, methacryloyl, methacryloyloxy, cyano, aldehyde and alkylcarbonyl groups. These groups are preferably bonded to the silicon atom via alkylene, alkenylene or arylene bridging groups which may be interrupted by oxygen or sulfur atoms or —NH— groups. The bridging groups mentioned, derive, for example, from the abovementioned alkyl, alkenyl or aryl radicals. The bridging groups of the R radicals contain preferably 1 to 18 and especially 1 to 8 carbon atoms.

Particularly preferred hydrolyzable silanes of the general formula (I) are tetraalkoxysilanes, such as tetraethoxysilane (TEOS) and tetramethoxysilane. Particularly preferred organosilanes of the general formula (II) are epoxysilanes such as 3-glycidyloxypropyltrimethoxysilane (GPTS) and silanes possessing reactive polymerizable double bonds, such as vinyltriethoxysilane, methacryloyloxypropyltrimethoxysilane and acryloyloxypropyltrimethoxysilane. Further silanes used with preference are dimethyldimethoxysilane, dimethyldiethoxysilane or methyltriethoxysilane. Preference is given to using combinations of silanes with a nonhydrolyzable radical having a polymerizable or polycondensable group and a further silane which does not have a polymerizable or polycondensable group.

It is of course also possible to use one or more silanes which have one or two nonhydrolyzable radicals without polymerizable or polycondensable groups and one or two nonhydrolyzable radicals with polymerizable or polycondensable groups, with a total of not more than three nonhydrolyzable radicals bonded to the Si.

Preference is given to using at least one silane which has a nonhydrolyzable radical with a polymerizable or polycondensable group. By means of these groups, optionally together with likewise used polymerizable or polycondensable organic monomers, oligomers and/or prepolymers, polymerization or polycondensation or crosslinking of the matrix material can be effected.

For distinction from the inorganic degree of condensation, which results from hydrolysis and condensation of the hydrolyzable inorganic compounds, for example to form Si—O—Si bridges, the extent of bond formation via the polymerizable or polycondensable groups of the nonhydrolyzable radicals of the hydrolyzable compounds is referred to hereinafter as the degree of organic polymerization or polycondensation.

The hydrolysis and polycondensation of the above compounds are performed in a conventional manner, optionally in the presence of a solvent and of an acidic or basic condensation catalyst such as HCl, $HNO_3$ or $NH_3$. For example, hydrolysis and polycondensation can be effected under the (commonly known) conditions of the sol-gel process.

To prepare the solid or gel-like but still curable matrix material, preference is given to hydrolyzing with a substochiometric amount of water, for example with 0.3 to 0.9 times the stochiometric amount. The condensation is effected preferably at a temperature of 5 to 40° C.

The solid or gel-like but still curable matrix material preferably comprises a condensate with a degree of inorganic condensation of 33 to 100% and a degree of organic polymerization or polycondensation of 0 to 95%. A degree of inorganic condensation of 33% means, for example, that an average of one of three hydrolyzable radicals has been condensed to form an inorganic bridge such as Si—O—Si. The degree of organic polymerization or polycondensation specifies how many polymerizable or polycondensable groups in the nonhydrolyzable radicals have been converted by a polymerization or polycondensation reaction; a degree of organic polymerization or polycondensation of 95% means, for example, that 95% of all polymerizable or polycondensable groups in the nonhydrolyzable radicals have been polymerized or polycondensed.

When the polymerizable or polycondensable group contains an olefinic double bond, the conversion can be monitored by means of IR spectroscopy. Polycondensation can be brought about, for example, by acidic or basic catalysis in the case of epoxy groups. Groups with olefinic double bonds can be polymerized, for example, by means of UV exposure.

In addition, the inventive formation of gradient structures can also be applied to composite materials. For this purpose, nanoscale particles which may optionally be surface-modified can be added to the invention. Depending on the material of the nanoscale particles, these may lead to an increase or a decrease in the refractive index. The nanoparticles may likewise have with polymerizable or polycondensable surface groups. The process according to the invention also leads to distinct improvements for these composite materials. The production and surface modification of nanoscale particles are known from WO 03/058292, to which explicit reference is hereby made. Depending on the method of execution, the nanoscale particles may be used as a diffusing component, i.e. analogously to the monomers, or else as part of the matrix.

The nanoscale particles usable with preference preferably have a diameter of not more than 100 nm, especially not more than 50 nm and more preferably not more than 20 nm. There are no particular restrictions with regard to the lower limit, although this lower limit for practical reasons is generally at 0.5 nm, especially 1 nm and more frequently 4 nm. The diffractive index depends on the type of particles and is known to the person skilled in the art.

The nanoscale particles are especially inorganic particles and include, for example, oxides such as ZnO, CdO, $SiO_2$, $TiO_2$, $ZrO_2$, $CeO_2$, $SnO_2$, $Al_2O_3$, $In_2O_3$, $La_2O_3$, $Fe_2O_3$, $Ta_2O_5$, $Cu_2O$, $V_2O_5$, $MoO_3$ or $WO_3$; chalcogenides, for example sulfides such as CdS, ZnS, PbS or $Ag_2S$; selenides such as GaSe, CdSe or ZnSe; and tellurides such as ZnTe or CdTe; halides such as AgCl, AgBr, AgI, CuCl, CuBr, $CdI_2$ or $PbI_2$; carbides such as $CdC_2$ or SiC; arsenides such as AlAs, GaAs or GeAs; antimonides such as InSb; nitrides such as BN, AlN, $Si_3N_4$ or $Ti_3N_4$; phosphides such as GaP, InP, $Zn_3P_2$ or $Cd_3P_2$; phosphates; silicates; zirconates; aluminates; stannates; and corresponding mixed oxides, for example those with perovskite structure, such as $BaTiO_3$ or $PbTiO_3$.

These nanoscale particles can be produced in a customary manner, for example by flame pyrolysis, plasma processes, colloid techniques, sol-gel processes, controlled nucleation and growth processes, MOCVD process and emulsion processes. The nanoscale particles can also be produced in situ in the presence of the still-liquid matrix material (or parts thereof), for example using sol-gel processes. These processes are described in detail in the literature.

Preference is given to using surface-modified nanoscale particles. The optional modification of the surface of the nanoscale particles with suitable functional groups (for example polymerizable or hydrophobic groups) is also known, for example, from DE-A-19719948 or DE-A-19746885 and EP-B-636111.

The production of surface-modified nanoscale particles can in principle be performed by two different routes, namely firstly by surface modification of already produced nanoscale inorganic solid particles and secondly by production of these inorganic nanoscale solid particles using one or more compounds which are suitable for the surface modification. For the surface modification directly in the course of production of the particles, all compounds mentioned below are also suitable for a suitable surface modification.

When a surface modification of already produced nanoscale particles is performed, suitable compounds for this purpose are all of those (preferably having a molecular weight below 300 and especially below 200) which have one or more groups which can react or at least interact with (functional) groups (for example OH groups in the case of oxides) present on the surface of the nanoscale solid particles.

Preference is given to the formation of covalent and/or coordinate bonds. Specific examples of organic compounds which can be used for surface modification of the nanoscale inorganic solid particles are, for example, saturated or unsaturated carboxylic acids, such as (meth)acrylic acid, β-dicarbonyl compounds (e.g. saturated or unsaturated β-diketones or β-carbonylcarboxylic acids), alcohols, amines, epoxides and the like.

Particular preference is given to performing the surface modification with hydrolytically condensable silanes having at least (and preferably) one nonhydrolyzable radical. Suitable for this purpose are, for example, the aforementioned hydrolyzable silanes of the formula (II), preferably those with a (meth)acryloyl group. Particular preference is given to the use of surface-modified particles which have a polymerizable or polycondensable group at the surface. These are more preferably (meth)acryloyl, allyl, vinyl, epoxy, hydroxyl, carboxyl or amino groups.

The nanocomposite material may also comprise additives customary for optical systems. Examples are plasticizers, optionally thermal or photochemical crosslinking initiators, sensitizers, wetting aids, adhesion promoters, leveling agents, antioxidants, stabilizers, dyes and photochromic or thermochromic compounds.

The composition preferably comprises polymerizable and/or polycondensable monomers, and at least one biological polymer, where the polymerizable and/or polycondensable monomers are present in excess based on the weight, preferably in a ratio of more than 10:1, or more than 30:1, preferably more than 50:1, more preferably more than 100:1.

The invention additionally also relates to an optical element with gradient structure, said gradient structure being formed by a refractive index gradient comprising the following components: 2 to 99.999% by weight of one or more polymers and 0.001% by weight to 1% by weight of one or more biological polymers. Preference is given to 99 to 99.999% by weight of one or more polymers.

In an advantageous development of the invention, the polymer(s) is/are selected from the group comprising poly(meth)acrylic acid and derivatives, poly(meth)acrylates, poly(meth)acrylonitriles, polystyrenes or polystyrene derivatives, polyalkenes, halogenated polyalkenes, polyvinyl acetate, polyvinylpyrrolidone, polyvinylcarbazole, poly(polyethylene glycol)(meth)acrylates, poly(polyethylene glycol)di(meth)acrylates.

They are preferably polymers of acrylates or methacrylates with one or more polymerizable groups, known as crosslinkers, which have been modified with oligomers and/or polymers. Very particular preference is given to monomers having a molar mass of up to 5000 g/mol, preferably up to 1500 g/mol, more preferably between 27 g/mol and 600 g/mol. Examples of such acrylates or methacrylates are polyethylene glycol di(meth)acrylates (PEGDMA), polyethylene glycol (meth)acrylates (PEGMA), tetramethylene glycol di(meth)acrylates (TMGDMA), bisphenol A di(meth)acrylates (BPADMA) or tetraethylene glycol di(meth)acrylates (TEGDMA).

In a further advantageous development, the optical element additionally comprises 0.1 to 98% by weight of one or more organic polymers selected from the group comprising polyacrylates, polymethacrylates, polyepoxides, polyvinyls, polyethylenes, polyethylene glycols, polystyrenes or polystyrene derivatives, polyalkenes, halogenated polyalkenes, polyvinyl acetate, polyvinylpyrrolidone or polyvinylcarbazole.

The optical element preferably comprises 49 to 98.999% by weight of one or more polymers and 1% by weight to 50% by weight of the additional polymer of an at least one polymer.

In a further advantageous development, the optical element additionally comprises 0.1 to 98% by weight of a cured matrix formed from polymers and/or from condensate of hydrolyzable silanes which may also have polymerizable and/or polycondensable groups. Examples of such condensates can be found in WO 03/058292, which is hereby explicitly incorporated by reference.

In the case of polymers, polyurethane resin coating materials and polyepoxy resin coating materials are preferred.

In a further advantageous development, the optical element additionally comprises nanoscale particles which have optionally been surface-modified. Examples of suitable particles which have optionally been surface-modified can be found in WO 03/058292, to which explicit reference is hereby made.

Preference is given, however, to compositions composed of only organic components without metal complexes or inorganic nanoparticles.

Preference is given to an optical element as per the process according to the invention.

Further details and features are evident from the description of preferred working examples which follows, in conjunction with the dependent claims. In this context, the particular features can each be implemented alone, or several in combination with one another. The means of achieving the object are not restricted to the working examples. For example, ranges reported always include all unspecified intermediate values and all conceivable partial ranges.

The components for production of the composition or of a precursor thereof can be mixed with one another in any desired manner and sequence.

For the coating, preference is given to selecting suitable substrates for optical applications, for example glass, ceramic, silicon, metal, semiconductor materials or (preferably transparent) polymers, such as PET, PE and PP. A particularly preferred substrate is a polymer film. The coating can be effected by customary methods, for example by dipping, flow coating, knife coating, pouring, spin coating, spraying, brushing, slot coating, meniscus coating, film casting or spinning. Suitable for this purpose are naturally liquid precursors of the composition, in which case the viscosity required can be established, for example, by adding or removing solvent(s). Preferred layer thicknesses (of the finished coating) are 0.2 to 300 μm, more preferably between 0.2 and 100 μm.

In this form, the film material can be stored in wound, light-protected and climatized (15 to 30° C.) form. In this way, a film assembly or composite can also be produced. Films with a coating which has a refractive index gradient, onto which a second film has optionally been laminated (film composite), are preferred inventive optical elements.

Advantageously, the composition can be dried before the exposure.

Subsequently, a potential difference is generated in the composition in the manner described above, such that directed diffusion and induced local polymerization or polycondensation form a refractive index gradient. The potential difference is preferably generated by an exposure process.

The processes which occur in generation of a potential difference are explained below for a preferred embodiment.

Local exposure locally polymerizes the monomers of the composition to form polymers. This gives rise to both linear and branched polymers. This forms a chemical potential gradient for as yet unpolymerized monomers to the unexposed neighboring region. From this neighboring region, further monomers therefore diffuse into the exposed region. This process can proceed during and after the exposure, and lasts for between a few seconds and a few minutes, according to the exposure conditions and temperature. As a result of the difference in refractive index between the different regions with different polymerization, a local refractive index gradient arises in this way.

Any added precursors of the curable matrix can be cured either before the application of the potential difference or during or after the application of the potential difference, preferably after the application of the potential difference.

In summary, the process according to the invention allows, in an inexpensive and efficient manner, the production of gradient structures by the use of biological polymers.

The process according to the invention is especially suitable for production of optical elements with a refractive index gradient. The optical elements are especially suitable as holographic applications, light management films, diffusers, planar gradient index lenses in imaging optics, head-up displays, head-down displays, light waveguides, in particular in optical telecommunications and transmission technology, and optical data stores. Examples of producible optical elements are security holograms, picture holograms, digital holograms for information storage, systems comprising components which process light wavefronts, planar waveguides, beam splitters and lenses.

In a preferred embodiment of the invention, a transmission hologram is produced by applying such an inventive composition to a glass surface and drying it. This produces layers with a thickness between 8 and 200 µm. With the aid of two-wave mixing of a laser beam having a wavelength between 300 nm and 500 nm and an intensity between 7 and 300 mW/cm², phase-modulated volume holograms are obtained both in the form of transmission holograms and in the form of reflection holograms. The exposure time is between 1 second and 10 minutes, preferably between 2 and 6 minutes.

A further particular aspect of the invention lies in the additional utilization of the sequence information present, for example, in DNA as an additional security feature in the optical element produced.

BRIEF DESCRIPTION OF THE DRAWINGS

FIG. 3b section enlargement from 3a;

DETAILED DESCRIPTION OF INVENTION

Figure 1:
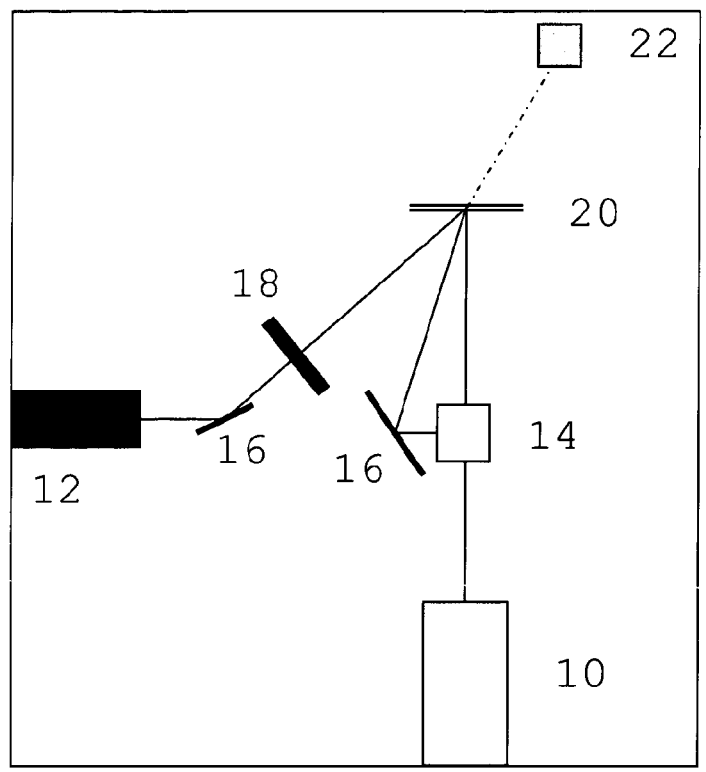
FIG. 1 experimental setup for generation and examination of the holograms.

FIG. 1 shows the setup used to generate the holograms. An AR$^+$ ion laser ($\lambda$=351 nm, 10) was used for writing. The writing process can be controlled by an He laser ($\lambda$=632.9 nm, 12). The hologram itself was generated by means of a beam splitter (14) in the beam path of the Ar$^+$ ion laser (10). These beams and the beam of the He laser (12) were passed to the sample (20) via several mirrors (16). To detect the hologram with the aid of the He laser (12), modulated to 124 Hz by means of a chopper (18), a detector connected to a lock-in amplifier (22, Stanford Research Systems SR 850 DSP) was used.

Preparation of the Lipophilic DNA

To prepare lipophilic DNA, 2.00 g of DNA (Sigma Aldrich, obtained from herring sperm) were incubated in 98.0 g of ultrapure water at 70° C. for 30 min, then stirred for 24 h and then filtered with the aid of sterile cellulose (0.2 µm).

Preparation of the CTMA (cetyltrimethylammonium chloride)/H$_2$O solution: 1.92 g of CTMA are dissolved in 100 ml of ultrapure H$_2$O and stirred for 24 h.

The solutions were mixed 1:1 (50 ml of each) and stirred for approx. 15 min. The precipitation reaction set in immediately. The precipitate was filtered off, washed with ultrapure H$_2$O and then dried in a drying cabinet at 37° C. over the course of 3 days (yield: 1.09 g). The yield was pulverized with the aid of a mortar and then 100 mg of the DNA-CTMA complex were dissolved in 10.0 ml of 2-propanol. This solution was used for the test.

Preparation of the Composition

The matrix material used was Synthomer M 50 polyvinyl acetate (PVAc); for this purpose, 5.20 g of PVAc were dissolved in 15.0 ml of acetone. To 2.00 ml of this solution were added 2.00 ml of tetraethylene glycol dimethacrylate (TEGDMA, tech. 90%), and then 2.00 ml of the DNA-CTMA-2-propanol solution. This forms slight white turbidity.

The blank samples used were analogously prepared solutions, but firstly without DNA-CTMA and secondly with DNA-CTMA but without TEGDMA.

Production of the Films

Several drops of the particular sols were applied to a glass microscope slide (Marienfeld) and then dried with warm air for 1 min. Subsequently, aluminum foil strips with a thickness of ~10-12 µm were placed on as spacers, and the samples were covered with a further microscope slide.

Generation of the Holograms

Example 1

Figure 2:
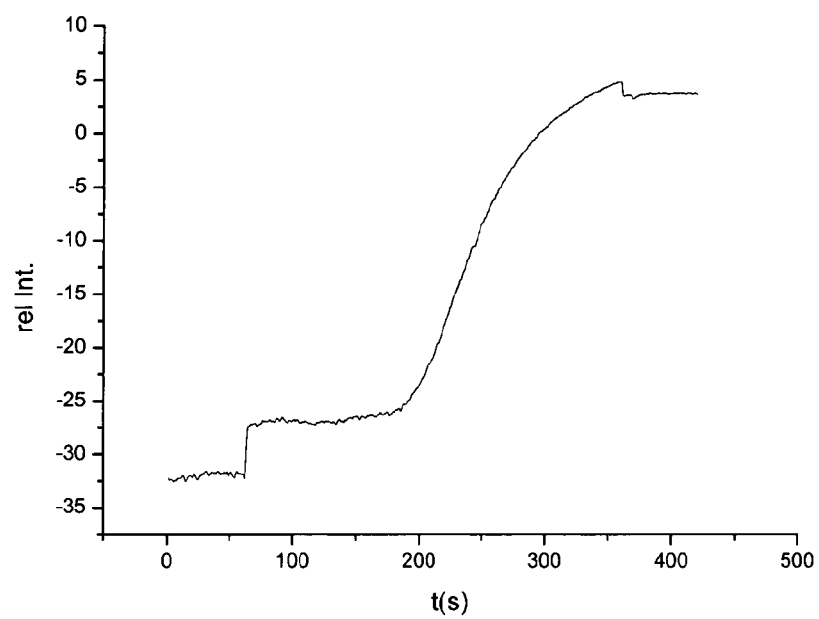
FIG. 2 measured intensity during the measurement.

A composition comprising CTMA-DNA, PVAc and TEGDMA was left to stand for 1 min before commencement of the exposure, then exposed for 5 min and then left to rest again for 1 min. FIG. 2 shows the profile of the intensity measured. The laser intensity was 18.5 mW 264 mW/cm².

Figure 3A:
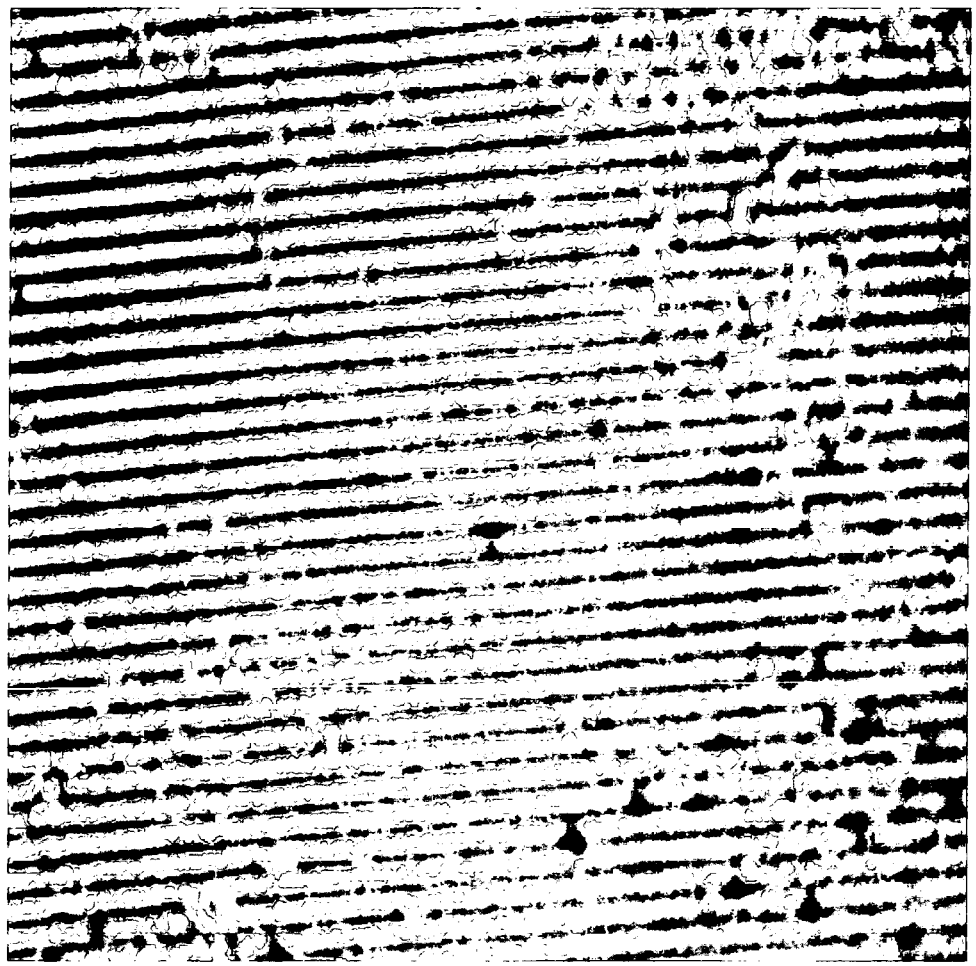
FIG. 3a light micrograph of a hologram obtained.
Figure 3B:
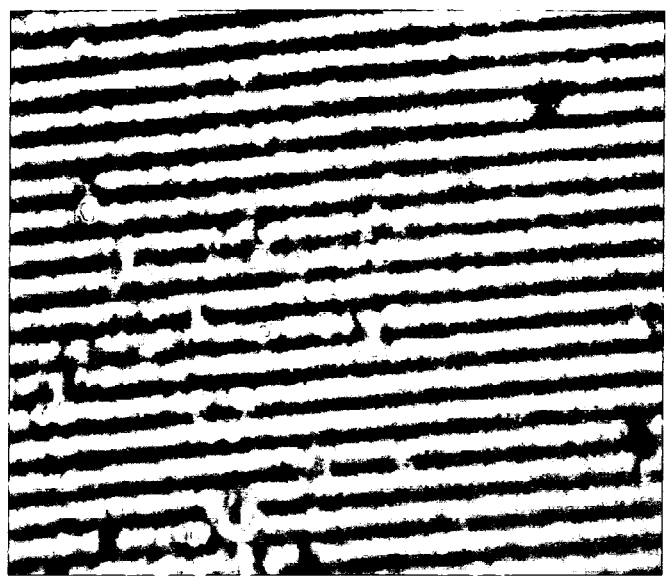

A hologram with two diffraction maxima in each case was obtained. FIG. 3a shows the hologram obtained under a light microscope. The distance between the lines from middle to middle is 10 µm; the width of the lines is about 2 µm. Diffraction efficiency $\eta$=2.2%. FIG. 3b shows a section enlargement of FIG. 3a.

Comparative Example 1

Under the conditions of example 1, a composition without CTMA-DNA was exposed. No hologram was obtained.

Comparative Example 2

A composition according to example 1 but without TEGDMA was left to rest for 1 min, then exposed for 5 min and then left to rest again for 1 min. The laser power was 19.3 mW (~276 mW/cm$^2$). No hologram was obtained.

Example 2

Figure 4:
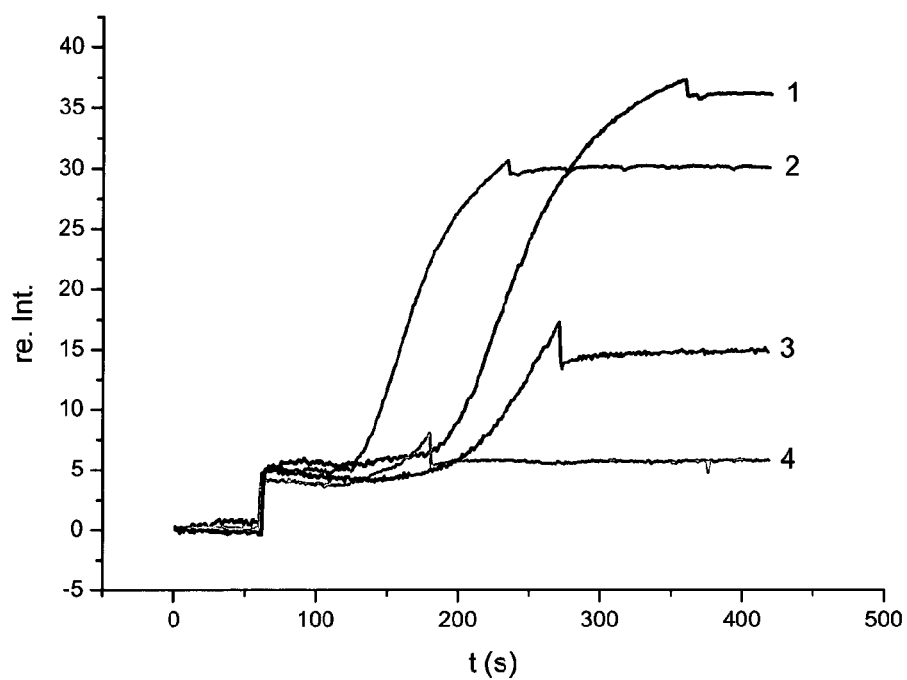
FIG. 4 comparison of different exposure conditions (normalized to a common start value)

The composition from example was exposed under different conditions. FIG. 4 shows the intensities measured (normalized to a common start value):

| Sample | Rest | Exposure | Rest |
|---|---|---|---|
| 1 | 1 min | 5 min | 1 min |
| 2 | 1 min | 3 min | 3 min |
| 3 | 1 min | 3.5 min | 2.5 min |
| 4 | 1 min | 2 min | 4 min |

Example 3

Figure 5:
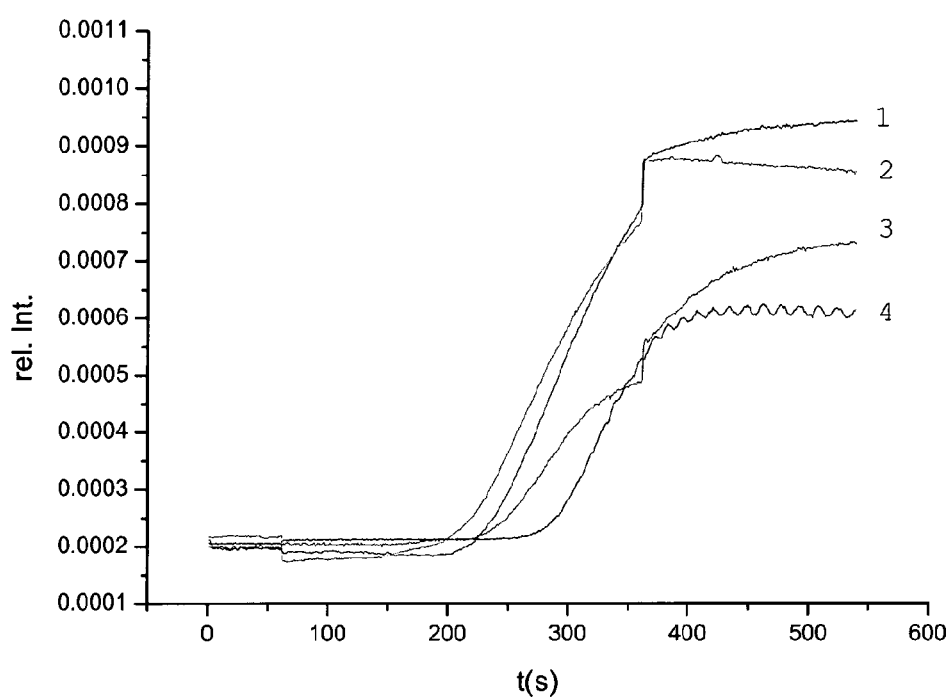
FIG. 5 comparison of samples with and without DNA (normalized to an equal start value)

In a further test, the mixtures according to example 1 were applied to a microscope slide with and without DNA, and dried at 70° C. for 1 h. Subsequently, Al spacers and a further microscope slide were again placed on and the samples were examined. They were left to rest for 1 min and then exposed for 5 min, then left to rest for 3 min. The laser power was 19.3 mW (FIG. 5). A hologram is obtained without DNA (curve 4), but the samples with DNA—measured at different points on the samples (curves 1-3)—have a much higher quality and react significantly more rapidly.

Example 4

Figure 6:
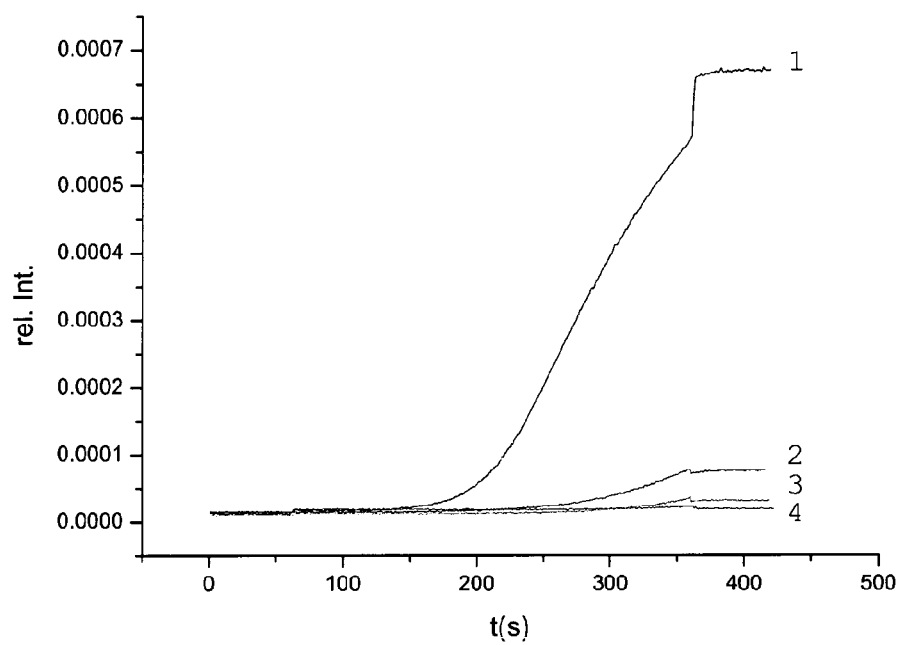
FIG. 6 comparison of samples with and without DNA (normalized to an equal start value).

In this experiment, composition according to example 1 including spacers and microscope slides was left in a drying cabinet at 100° C. for 30 min and then examined as in example 1 (1 min/5 min/1 min; laser power 19.3 mW, FIG. 6). The sample with DNA (curve 1) is clearly evident. The samples without DNA (curves 2-4) were analyzed at several points.

| List of reference numerals | |
|---|---|
| 10 | Ar$^+$ ion laser |
| 12 | He laser |
| 14 | Beam splitter |
| 16 | Mirror |
| 18 | Chopper |
| 20 | Sample |
| 22 | Detector connected to a lock-in amplifier |

LIST OF LITERATURE CITED

WO 2008-004203
US 2005-0008762
WO 03/058292
DE-A-19719948
DE-A-19746885
EP-B-636111

The invention claimed is:

1. A process for producing optical elements with gradient structure, said gradient structure being formed by a refractive index gradient, comprising:
   preparing a composition composed of one or more polymerizable and/or polycondensable monomers and at least one biological polymer, wherein the at least one biological polymer comprises nucleobases and/or derivatives thereof; and
   generating a potential difference for directed diffusion of the monomers to form a refractive index gradient by inducing local polymerization or polycondensation.

2. The process as claimed in claim 1, wherein the potential difference is generated by exposure.

3. The process as claimed in claim 2, wherein the potential difference is generated by exposure with UV light, laser light, and/or by electron irradiation.

4. The process as claimed in claim 1, wherein the potential difference is generated by holographic or lithographic techniques.

5. The process as claimed in claim 1, wherein the biological polymer comprises DNA, RNA and/or derivatives thereof.

6. The process as claimed in claim 1, wherein the biological polymer is in a form which is soluble in the composition.

7. The process as claimed in claim 1, wherein the one or more polymerizable and/or polycondensable organic monomers is selected from the group consisting of (meth)acrylic acid and derivatives, (meth)acrylic ester and derivatives, (meth)acrylonitriles, styrenes or styrene derivatives, alkenes, halogenated alkenes, vinyl acetate, vinylpyrrolidone and vinylcarbazole.

8. The process as claimed in claim 1, wherein the composition comprises at least one organic polymer selected from the group consisting of poly(meth)acrylic acid and derivatives, poly(meth)acrylates, poly(meth)acrylonitriles, polystyrenes or polystyrene derivatives, polyalkenes, halogenated polyalkenes, polyvinyl acetate, polyvinylpyrrolidone, polyvinylcarbazole, poly(polyethylene glycol) meth(acrylates), and poly(polyethylene glycol)di(meth)acrylates.

9. The process as claimed in claim 1, wherein the composition comprises:
   2 to 99.999% by weight of one or more polymerizable and/or polycondensable monomers; and
   0.001% by weight to 1% by weight of one or more biological polymers.

10. An optical element obtainable according to claim 1.

11. An optical element according to claim 10, wherein said optical element comprises a hologram.

12. A system comprising an optical element according to claim 10, wherein said system comprises planar gradient index lenses in imaging optics, light management films, diffusers, head-up displays, head-down displays, light waveguides and/or optical data stores.

13. The use of an optical element with gradient structure for holographic applications, planar gradient index lenses in imaging optics, light management films, diffusers, head-up displays, head-down displays, light waveguides and/or optical data stores, obtainable according to claim 1.

14. The process as claimed in claim 1, wherein a weight ratio of monomers to the at least one biological polymer is more than 10:1.

15. An optical element with gradient structure, said gradient structure being formed by a refractive index gradient, comprising:
   2 to 99.999% by weight of one or more polymers formed of locally polymerized and/or polycondensed monomers; and
   0.001% by weight to 1% by weight of at least one biological polymer, wherein the at least one biological polymer comprises nucleobases and/or derivatives thereof.

16. The optical element as claimed in claim 15, wherein the biological polymer comprises DNA, RNA and/or derivatives thereof.

* * * * *